(12) United States Patent
Meng (10) Patent No.: US 10,431,692 B2
(45) Date of Patent: Oct. 1, 2019

(54) PREPARATION METHODS FOR SEMICONDUCTOR LAYER AND TFT, TFT AND ARRAY SUBSTRATE COMPRISING SEMICONDUCTOR LAYER

(71) Applicant: BOE TECHNOLOGY GROUP CO., LTD., Beijing (CN)

(72) Inventor: Hu Meng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/533,128

(22) PCT Filed: May 20, 2016

(86) PCT No.: PCT/CN2016/082771
§ 371 (c)(1),
(2) Date: Jun. 5, 2017

(87) PCT Pub. No.: WO2017/152500
PCT Pub. Date: Sep. 14, 2017

(65) Prior Publication Data
US 2018/0108783 A1    Apr. 19, 2018

(30) Foreign Application Priority Data

Mar. 7, 2016 (CN) .......................... 2016 1 0128473

(51) Int. Cl.
*H01L 27/12* (2006.01)
*H01L 27/32* (2006.01)
(Continued)

(52) U.S. Cl.
CPC ...... *H01L 29/78675* (2013.01); *H01L 27/124* (2013.01); *H01L 27/1222* (2013.01);
(Continued)

(58) Field of Classification Search
CPC ......... H01L 29/78675; H01L 29/66757; H01L 29/4908; H01L 29/78618; H01L 29/458;
(Continued)

(56) References Cited

U.S. PATENT DOCUMENTS

2003/0165418 A1* 9/2003 Ajayan .................. B82Y 30/00
                                              423/447.2
2004/0142285 A1* 7/2004 Jung ...................... B82Y 10/00
                                              430/315
(Continued)

FOREIGN PATENT DOCUMENTS

CN          1500715 A      6/2004
CN        102627409 A      8/2012
(Continued)

OTHER PUBLICATIONS

Second Office Action for Chinese Patent Application No. 201610128473.9 dated Mar. 6, 2018.
(Continued)

*Primary Examiner* — Nduka E Ojeh
(74) *Attorney, Agent, or Firm* — Calfee, Halter & Griswold LLP (57) ABSTRACT

Embodiments of the present disclosure provide preparation methods for a semiconductor layer and a TFT, a TFT and an array substrate. The preparation method for a semiconductor layer includes forming a silicon dioxide film on a substrate; forming sidewalls at two ends of the semiconductor layer to be formed by patterning process; performing amination treatment on the sidewalls so that an aminosiloxane monolayer self-assembly is formed on the surface of the sidewalls; carboxylating a carbon nanotube solution and making the carboxylated carbon nanotube solution on the surface of the substrate with the sidewalls formed to form a carbon nanotube film; removing portions of the carbon nanotube
(Continued)

film other than the portion between the sidewalls to form a semiconductor layer.

5 Claims, 4 Drawing Sheets

(51) Int. Cl.
    *H01L 29/66*     (2006.01)
    *H01L 51/05*     (2006.01)
    *H01L 51/00*     (2006.01)
    *H01L 29/08*     (2006.01)
    *H01L 35/24*     (2006.01)
    *H01L 29/786*     (2006.01)
    *H01L 29/417*     (2006.01)
    *H01L 29/423*     (2006.01)
    *H01L 29/45*     (2006.01)
    *H01L 29/49*     (2006.01)

(52) U.S. Cl.
    CPC ...... *H01L 27/1288* (2013.01); *H01L 27/3262* (2013.01); *H01L 29/41733* (2013.01); *H01L 29/42384* (2013.01); *H01L 29/458* (2013.01); *H01L 29/4908* (2013.01); *H01L 29/4958* (2013.01); *H01L 29/66757* (2013.01); *H01L 29/78618* (2013.01); *H01L 29/78633* (2013.01); *H01L 29/78684* (2013.01); *H01L 29/78696* (2013.01); *H01L 51/0541* (2013.01); *H01L 51/0048* (2013.01)

(58) Field of Classification Search
    CPC ............. H01L 27/3262; H01L 27/1288; H01L 29/78633; H01L 29/41733; H01L 27/1222; H01L 29/4958; H01L 29/42384; H01L 29/78696; H01L 27/124; H01L 29/786; H01L 27/12

USPC .............................. 257/40, E51.04; 438/149
See application file for complete search history.

(56) References Cited

U.S. PATENT DOCUMENTS

| | | | |
|---|---|---|---|
| 2005/0019791 A1 | 1/2005 | Jung et al. | |
| 2009/0008629 A1* | 1/2009 | Matsumoto | B82Y 10/00 257/24 |
| 2011/0062419 A1* | 3/2011 | Kikuchi | B82Y 10/00 257/24 |
| 2011/0147715 A1* | 6/2011 | Rogers | B82Y 10/00 257/24 |
| 2016/0071891 A1* | 3/2016 | Oh | H01L 27/1248 257/72 |
| 2016/0293771 A1 | 10/2016 | Long et al. | |
| 2017/0294583 A1* | 10/2017 | Liang | H01L 21/02 |

FOREIGN PATENT DOCUMENTS

| | | |
|---|---|---|
| CN | 104253159 A | 12/2014 |
| CN | 105336792 A | 2/2016 |
| JP | 2009252798 A | 10/2009 |

OTHER PUBLICATIONS

First Office Action from China Application No. 201610128473.9 dated Aug. 30, 2017.
International Search Report for Chinese International Application No. PCT/CN2016/082771 dated Dec. 13, 2016.
Dong-Ming Sun, et al., "Flexible high-performance carbon nanotube integrated circuits," Nature Nanatechnology, vol. 6, 2011, pp. 156-161.
Dongil Lee, et al., "High-Performance thin-film transistors produced from highly separated solution-processed carbon nanotubes," Applied Physics Letters 104, 143508 (2014).

* cited by examiner

PREPARATION METHODS FOR SEMICONDUCTOR LAYER AND TFT, TFT AND ARRAY SUBSTRATE COMPRISING SEMICONDUCTOR LAYER

RELATED APPLICATION

The present application is the U.S. national phase entry of PCT/CN2016/082771, with an international filing date of May 20, 2016, which claims the benefit of Chinese Patent Application No. 201610128473.9, filed on Mar. 7, 2016, the entire disclosure of which is incorporated herein by reference.

FIELD

The present disclosure relates to the field of display technology, and particularly to preparation methods for a semiconductor layer and a TFT, a TFT, and an array substrate.

BACKGROUND

Carbon nanotube (CNT for short) has been widely concerned and studied by academia and industry since it was discovered in Jan. 1991 by the Japanese physicist, Sumio Iijima, from carbon fibers produced by arc method using a high-resolution transmission electron microscopy. CNT is a tubular carbon molecule. Each carbon atom on the tube is SP2 hybridized, and carbon atoms are bonded to each other by a carbon-carbon σ bond, forming a honeycomb structure composed of hexagons as the CNT skeleton. The molecular structure of CNT decides its unique properties including excellent electrical properties, good thermal conductivity, high mechanical strength, and the like.

At present, CNT is widely applied in the fields such as display, sensors, RF circuits, flexible circuits, and so on. When applied to a thin film transistor (TFT), CNT is used as a material for the semiconductor layer. In the prior art, CNT is fabricated mainly by liquid phase method and gas phase method as the semiconductor layer in a TFT.

The liquid phase method is to disperse the prepared CNT in water or an organic solvent after purification, and fabricate it on a required substrate by immersion, spin coating, spraying, etc, thereby forming a semiconductor layer by patterning process. However, the CNTs in the semiconductor layer formed on the substrate by liquid phase method are generally a random network, and there are many CNT tube-tube junction contact nodes, resulting in a mobility of typically not more than 100 $cm^2/V.s$. As a result, the potential of CNT is not exerted, and the uniformity and the channel positioning of the CNT network are poor.

In the gas phase method, CNT parallel arrays can be directly fabricated on a substrate, which can greatly reduce the number of CNT tube-tube junction contact nodes and increase the mobility. However, when the semiconductor layer is prepared by gas phase method, the temperature required is relatively high, the substrate for growing the CNT parallel arrays is very restricted, the proportion of metallic CNTs is difficult to decrease, and the device's switching performance is relatively poor.

SUMMARY

Embodiments of the present disclosure provide preparation methods for a semiconductor layer and a TFT, a TFT and an array substrate, which solve the problem that the mobility of the semiconductor layer prepared by liquid phase method in the prior art is low, and the problems that the purity of the semiconductor is not high, the substrate is restricted, the proportion of metallic CNTs is high, etc existing in the semiconductor layer prepared by gas phase method.

To achieve the above purposes, a first aspect of the present disclosure provides a preparation method for a semiconductor layer, comprising:

forming sidewalls at two ends of the semiconductor layer to be formed on a substrate;

carboxylating a carbon nanotube solution and making the carboxylated carbon nanotube solution on a surface of the substrate with the sidewalls formed to form a carbon nanotube film;

removing portions of the carbon nanotube film other than a portion between the sidewalls by etching process to form the semiconductor layer, wherein the sidewalls and the carbon nanotube film form a self-assembly.

In some embodiments, the above preparation method further comprises subjecting the sidewalls to amination treatment.

In some embodiments, the sidewalls are made of silicon dioxide.

In some embodiments, subjecting the sidewalls to amination treatment comprises dip coating or spraying an aminopropylsilane solution on the substrate with the sidewalls formed.

In some embodiments, carboxylating a carbon nanotube solution comprises mixing a strong oxidizing agent with the carbon nanotube solution to carboxylate the carbon nanotube solution.

A second aspect of the present disclosure provides a preparation method for a TFT, comprising forming, on a substrate, a gate, a gate insulating layer, a semiconductor layer, a source and a drain, wherein the semiconductor layer is obtained by the preparation method described above.

In some embodiments, the preparation method specifically comprises: forming the semiconductor layer on a substrate; forming the gate insulating layer on the substrate with the semiconductor layer formed; forming a metal film on the substrate with the gate insulating layer formed, and forming the gate, the source and the drain by one patterning process; wherein the source and the drain are in contact with the semiconductor layer.

In some embodiments, forming the gate insulating layer comprises: forming a gate insulating film on the substrate with the semiconductor layer formed, forming a via hole penetrating the gate insulating film and the semiconductor layer by patterning process to form the gate insulating layer; wherein the via hole is immediately close to the sidewalls.

In some embodiments, the substrate is a flexible substrate or a rigid substrate.

A third aspect of the present disclosure provides a TFT comprising: a gate, a gate insulating layer, a semiconductor layer, a source and a drain, as well as sidewalls disposed on two sides of the semiconductor layer, wherein the sidewalls and the semiconductor layer form a self-assembly.

In some embodiments, the sidewalls comprise a body of silicon dioxide material and an aminosiloxane monolayer self-assembly covering a surface of the body.

In some embodiments, the semiconductor layer is disposed close to the substrate; the gate, the source and the drain are disposed in a same layer; the gate insulating layer is disposed between the semiconductor layer, and the gate, the source and the drain; wherein the source and the drain are in contact with the semiconductor layer.

In some embodiments, the source and the drain are in contact with both the sidewalls and the semiconductor layer through via holes in the gate insulating layer.

A fourth aspect of the present disclosure provides an array substrate comprising the TFT described above.

Embodiments of the present disclosure provide preparation methods for a semiconductor layer and a TFT, a TFT and an array substrate. By forming sidewalls at two ends of the semiconductor layer to be formed, and making the carboxylated CNT solution on the surface of the substrate with the sidewalls formed so that the carboxylated CNT solution is self-assembled three-dimensionally with the sidewalls, the number of CNT tube-tube junction contact nodes would be reduced such that the mobility of the prepared semiconductor layer is increased. As compared with the existing semiconductor layer prepared by liquid phase method, since the CNT tube-tube junction contact nodes in the semiconductor layer according to embodiments of the present disclosure is smaller, the mobility of the semiconductor layer is higher. Moreover, the CNTs in the prepared semiconductor layer form parallel arrays, thus both the uniformity and the channel positioning of the CNTs are better. As compared with the existing semiconductor layer prepared by gas phase method, the substrate is not restricted by high temperature-resistant material, and the purity of the semiconductor layer is higher and the proportion of metallic CNTs is lower.

BRIEF DESCRIPTION OF DRAWINGS

In order to more clearly illustrate the technical solutions in embodiments of the present disclosure or the prior art, the drawings which are required for describing the embodiments or the prior art will be briefly described below. It is apparent that the drawings in the description below are just some embodiments of the present disclosure, and those ordinarily skilled in the art can further obtain other drawings based on these drawings without spending inventive efforts.

DETAILED DESCRIPTION

The technical solutions in embodiments of the present disclosure will now be described below clearly and completely with reference to the accompanying drawings in embodiments of the present disclosure. Obviously, the described embodiments are merely part of the embodiments of the present disclosure, rather than all of them. All other embodiments obtained by those ordinarily skilled in the art based on the embodiments of the present disclosure without spending inventive efforts fall within the scope of this disclosure.

In the drawings, the following references are used:
10-substrate; 20-sidewall; 30-semiconductor layer; 301-CNT film; 40-gate insulating layer; 50-source; 60-drain; 70-gate; 801-pixel electrode; 802-common electrode; 803-anode; 804-cathode; 805-organic material functional layer.

Figure 1:
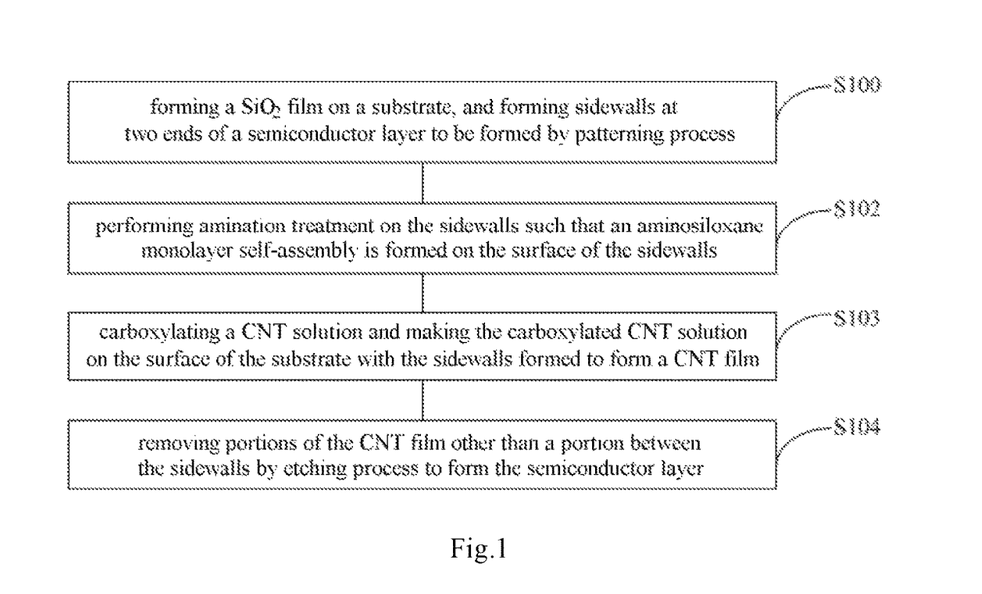
FIG. 1 is a schematic flow chart showing a preparation method for a semiconductor layer provided by embodiments of the present disclosure.
Figure 2:
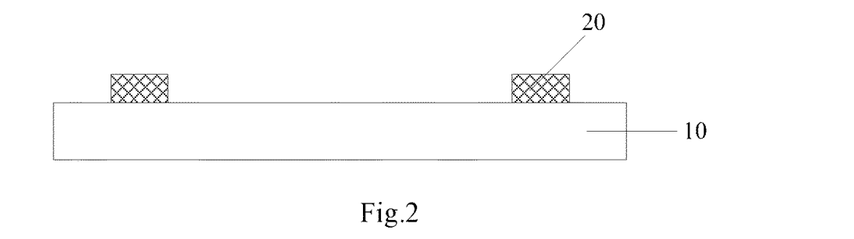
FIG. 2 is a schematic structural view showing formation of sidewalls on a substrate provided by embodiments of the present disclosure.

Embodiments of the present disclosure provide a preparation method for a semiconductor layer, comprising, as shown in FIG. 1: at step S100, forming an SiO$_2$ (silicon dioxide) film on a substrate 10, and forming sidewalls 20 at two ends of a semiconductor layer to be formed by patterning process, as shown in FIG. 2. That is, the material of the sidewalls 20 is SiO$_2$.

The substrate 10 may be a flexible substrate such as a polyethylene terephthalate (PET) substrate, a polyimide (PI) substrate, or the like. Of course, it may also be a rigid substrate such as a glass substrate, a silicon oxide substrate, a silicon nitride substrate, or the like.

Here, the SiO$_2$ film may be formed, for example, by a plasma enhanced chemical vapor deposition (PECVD) method, a chemical vapor deposition (CVD) method, or the like.

On such basis, forming sidewalls 20 at two ends of the semiconductor layer to be formed by patterning process may include, for example, forming a photoresist on the substrate 10 with the SiO$_2$ film formed, so that a light-tight portion of a mask corresponds to the region where the sidewalls 20 are to be formed and a light-transmitting portion of the mask corresponds to the other region, performing exposure and development, then removing the SiO$_2$ film exposed after development (i.e. the SiO$_2$ film in the region corresponding to the light-transmitting portion of the mask) using etching process to thereby form the sidewalls 20, and then removing the photoresist on the sidewalls 20. Here, a positive photoresist is described as an example. However, it will be appreciated by those skilled in the art that the sidewalls 20 may be fabricated using a negative photoresist. In this case, the light-transmitting portion of the mask corresponds to the region where the sidewalls 20 are to be formed. The above etching process may employ etching process such as reactive ion etching (RIE), inductively coupled plasma (ICP) etching, or the like.

It is to be noted that the height and length of the sidewalls 20 may be determined depending on the height and region of the semiconductor layer to be formed, and the width of the sidewalls 20 (taking the horizontal direction in FIG. 2 for reference) should not affect the overall size of the device (e.g. thin film transistor) to which the semiconductor layer is applied.

At step S101, the sidewalls 20 are subjected to amination treatment so that an aminosiloxane monolayer self-assembly is formed on the surface of the sidewalls 20.

Since the material of the sidewalls 20 is $SiO_2$, after the sidewalls 20 are subjected to amination treatment, $SiO_2$ located on the outer surfaces of the sidewalls 20 (i.e. the remaining surface of the sidewalls 20 except the surface in contact with the substrate 10) may react with the solution used in the above amination treatment, so that an aminosiloxane monolayer self-assembly may be formed on all the outer surfaces of the sidewalls 20.

Here, the sidewalls 20 may be subjected to amination treatment by dip coating or spraying, etc. The solution used in the amination treatment is not defined as long as an aminosiloxane monolayer self-assembly can be formed on the surface of the sidewalls 20.

It is to be noted that, in embodiments of the present disclosure, the sidewalls 20 may still be referred to as the sidewalls 20 after they have been subjected to amination treatment.

Figure 3:
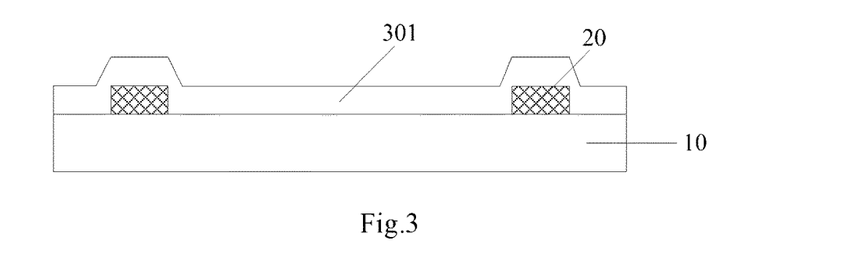
FIG. 3 is a schematic structural view showing formation of an SiO$_2$ film on a substrate provided by embodiments of the present disclosure.

At step S102, the CNT solution is carboxylated as shown in FIG. 3, and the carboxylated CNT solution is made on the surface of the substrate 10 with the sidewalls 20 formed, thereby forming a CNT film 301.

Since the aminosiloxane monolayer self-assembly is formed on each outer surface of the sidewalls 20, when the carboxylated CNT solution is made on the surface of the substrate 10 with the sidewalls 20 formed, the carboxylated CNT solution may be self-assembled three-dimensionally with the aminosiloxane monolayer self-assembly on each surface of the sidewalls 20 (i.e. each outer surface of the sidewalls 20) which it contacts.

When the carboxylated CNT solution comes into contact with the aminosiloxane monolayer self-assembly formed on each outer surface of the sidewalls 20, CNTs arranged in parallel may be formed on each outer surface.

Although the CNTs assembled on each outer surface of the sidewalls 20 are arranged in parallel, the CNTs assembled on non-parallel outer surfaces are not parallel to each other.

For example, on two opposite outer surfaces of the sidewalls 20, CNTs arranged in parallel which are perpendicular to said opposite outer surfaces may be formed. On the upper surfaces of the sidewalls 20 which are opposite to the substrate 10, CNTs arranged in parallel which are perpendicular to said upper surfaces may be formed. On other outer surfaces of the sidewalls 20, CNTs arranged in parallel which are perpendicular to said outer surfaces may also be formed.

On such basis, since the CNT film formed between two sidewalls 20 is used as the semiconductor layer 30 in embodiments of the present disclosure, and the remaining film would be removed, upon formation of the CNT film, though the directions of the CNTs on different surfaces of the sidewalls 20 may be different, the CNT film other than the CNT film between two sidewalls 20 would be etched, thus the CNTs in the semiconductor layer 30 finally formed between two sidewalls 20 are still arranged in parallel.

It is to be noted that, ideally, on each outer surface, CNTs arranged in parallel which are perpendicular to said outer surface may be formed. However, during the actual fabrication process, the CNTs arranged in parallel may not be ideally completely perpendicular to the corresponding outer surface, but the CNTs are still arranged in parallel.

Here, the carboxylated CNT solution may be fabricated by dip coating or spraying on the surface of the substrate 10 with the sidewalls 20 formed. The solution used for the above carboxylation is not defined as long as the carboxylated CNT solution performs three-dimensional self-assembly with the sidewall 20 which has been subjected to amination treatment when the carboxylated CNT solution is coated on the surface of the substrate 10 by liquid phase method.

As regards the preparation method for the CNT solution, CNTs can be first prepared by a method such as graphite arc method, catalytic cracking method or laser evaporation method, the CNTs are then purified by physical or chemical method, and finally the CNTs are dispersed in water or an organic solvent (for example, ethanol or isopropanol, etc) to form a uniformly dispersed high purity (99%) semiconductor CNT solution.

Figure 4:
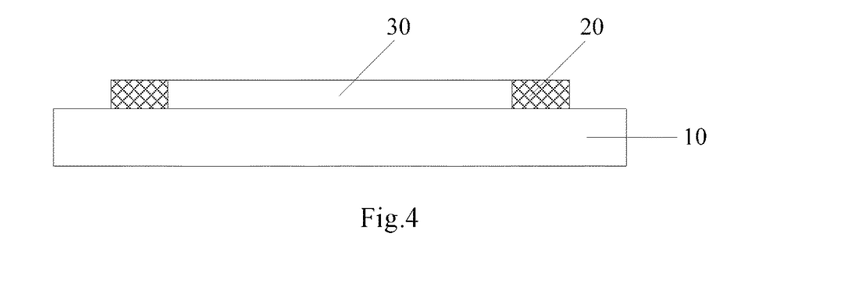
FIG. 4 is a schematic structural view showing formation of a semiconductor layer on a substrate provided by embodiments of the present disclosure.

At step S103, as shown in FIG. 4, the semiconductor layer 30 is formed by removing the portions of the CNT film other than the portion between the sidewalls 20 by etching process.

Since the opposite outer surfaces of the two sidewalls 20 have certain height and width, when the carboxylated CNT solution is in contact with the aminosiloxane monolayer self-assembly on the surface of the sidewalls 20, the carboxylated CNT solution can be self-assembled with the aminosiloxane monolayer self-assembly in both the height and the width direction of the opposite outer surfaces of the two sidewalls 20 so as to form CNTs arranged in parallel in the height and width directions of the opposite outer surfaces of the two sidewalls 20. Thus, CNTs arranged in parallel three-dimensionally (i.e. in the directions of the length between the two sidewalls 20, and the height and width of the opposite outer surfaces of the two sidewalls 20) can be formed between the two sidewalls 20, i.e. the CNTs formed in the semiconductor layer 30 are arranged in parallel three-dimensionally.

Here, removing the portions of the CNT film other than the portion between the sidewalls 20 by etching process may include, for example, forming a photoresist on the substrate 10 with the CNT film 301 formed, so that a light-tight portion of a mask corresponds to the region where the semiconductor layer is to be formed and a light-transmitting portion of the mask corresponds to the other region, performing exposure and development, then removing the CNT film exposed after development (i.e. the CNT film in the region corresponding to the light-transmitting portion of the mask) using etching process to thereby form the semiconductor layer 30, and then removing the photoresist on the semiconductor layer 30. Here, a positive photoresist is described as an example. However, it will be appreciated by those skilled in the art that the semiconductor layer may be fabricated using a negative photoresist. In this case, the light-transmitting portion of the mask corresponds to the region where the semiconductor layer is to be formed. The above etching process may employ RIE, ICP, or the like.

Embodiments of the present disclosure provide a preparation method for a semiconductor layer. By forming sidewalls 20 made of $SiO_2$ material at two ends of a semiconductor layer to be formed, subjecting the sidewalls to amination treatment such that an aminosiloxane monolayer self-assembly is formed on the surface of the sidewalls 20, and then making the carboxylated CNT solution on the surface of the substrate 10 with the sidewalls 20 formed so that the carboxylated CNT solution is self-assembled three-dimensionally with the aminosiloxane monolayer self-assembly formed on the surface of the sidewalls 20, the number of CNT tube-tube junction contact nodes would be reduced such that the mobility of the prepared semiconductor layer 30 is increased. As compared with the existing semiconductor layer prepared by liquid phase method, since the CNT tube-tube junction contact nodes in the semiconductor layer 30 according to embodiments of the present disclosure is smaller, the mobility of the semiconductor layer 30 is higher. Moreover, the CNTs in the prepared semiconductor layer 30 form parallel arrays, thus both the uniformity and the channel positioning of the CNTs are better. As compared with the existing semiconductor layer 30 prepared by gas phase method, the substrate 10 is not restricted by high temperature-resistant material, and the purity of the semiconductor layer 30 is higher and the proportion of metallic CNTs is lower.

Specifically, step S101 of subjecting the sidewalls 20 to amination treatment comprises:

dip coating or spraying an aminopropylsilane solution on the substrate 10 with the sidewalls 20 formed.

When the aminopropylsilane solution is dip coated or sprayed on the substrate with the sidewall 20 formed, the aminopropylsilane would react with $SiO_2$, thereby forming an aminosiloxane monolayer self-assembly on the surface of the sidewalls 20.

Here, the aminopropylsilane solution may include aminopropyltriethoxy silane (APTES) solution, aminopropyltrimethoxysilane (APTMS), and the like.

Here, the time for dip coating or spraying the aminopropylsilane solution on the substrate with the sidewalls 20 formed should enable the aminopropylsilane to react with $SiO_2$ and the aminosiloxane monolayer self-assembly to be formed on the surface of the sidewalls 20.

Specifically, step S102 of carboxylating the CNT solution comprises mixing a strong oxidizing agent with the CNT solution to carboxylate the CNT solution.

The strong oxidizing agent may be, for example, nitric acid, concentrated sulfuric acid or the like.

When the CNT solution is carboxylated, the ratio of the strong oxidizing agent to the CNT solution should ensure that CNTs in the CNT solution are all carboxylated. Here, it is also possible to accelerate the carboxylation of the CNT solution by heating and stirring the strong oxidizing agent and CNT mixed solution. The CNT solution is a uniformly dispersed high purity (≥99%) semiconductor CNT solution.

Figure 5:
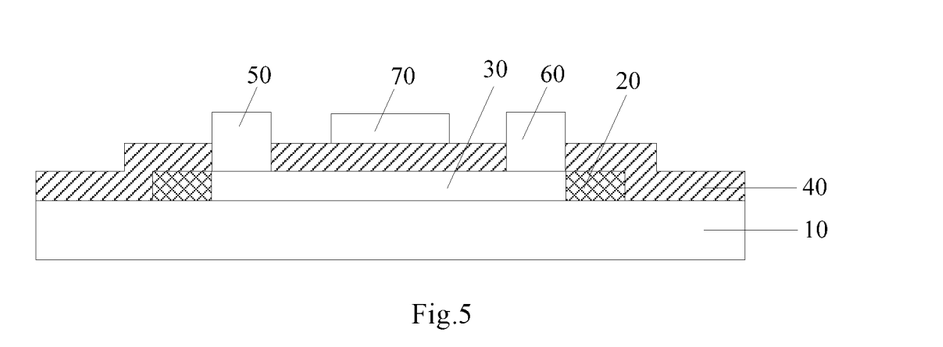
FIG. 5 is a schematic structural view of a TFT provided by embodiments of the present disclosure.
Figure 6:
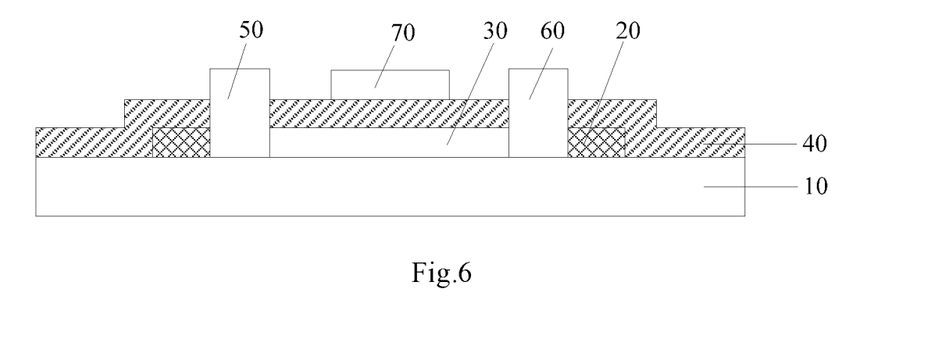
FIG. 6 is a schematic structural view of another TFT provided by embodiments of the present disclosure.

Embodiments of the present disclosure further provide a preparation method for a TFT comprising, as shown in FIGS. 5 and 6, forming a gate 70, a gate insulating layer 40, a semiconductor layer 30, a source 50 and a drain 60 on a substrate 10, wherein the semiconductor layer 30 is obtained by the above-described preparation method.

The substrate 10 may be a flexible substrate such as a PET substrate, a PI substrate, or the like, and may certainly be a rigid substrate such as a glass substrate, a silicon oxide substrate, a silicon nitride substrate, or the like.

Here, the TFT prepared by embodiments of the present disclosure may be a top gate type TFT, a bottom gate type TFT or a double gate type TFT.

Embodiments of the present disclosure provide a preparation method for a TFT. Upon formation of the semiconductor layer 30 therein, by forming sidewalls 20 made of $SiO_2$ material at two ends of the semiconductor layer to be formed, subjecting the sidewalls 20 to amination treatment such that an aminosiloxane monolayer self-assembly is formed on the surface of the sidewalls 20, and then making the carboxylated CNT solution on the surface of the substrate 10 with the sidewalls 20 formed so that the carboxylated CNT solution is self-assembled three-dimensionally with the aminosiloxane monolayer self-assembly formed on the surface of the sidewalls 20, the number of CNT tube-tube junction contact nodes is reduced such that the mobility of the prepared semiconductor layer 30 is increased. As compared with the existing semiconductor layer prepared by liquid phase method, since the CNT tube-tube junction contact nodes in the semiconductor layer 30 according to embodiments of the present disclosure is smaller, the mobility of the semiconductor layer 30 is higher. Moreover, the CNTs in the prepared semiconductor layer 30 form parallel arrays, thus both the uniformity and the channel positioning of the CNTs are better. As compared with the existing semiconductor layer 30 prepared by gas phase method, the substrate 10 is not restricted by high temperature-resistant material, the purity of the semiconductor layer 30 is higher, the proportion of metallic CNTs is lower, and the switching performance of the TFT is better.

Further, since the semiconductor layer 30 is formed between the two sidewalls 20 and the two sidewalls 20 can be precisely positioned on the substrate 10 during the fabricating process, the semiconductor layer 30 formed between the two sidewalls 20 can be positioned so that the formed TFT can be positioned and integrated on the substrate 10 on a large scale.

Figure 7:
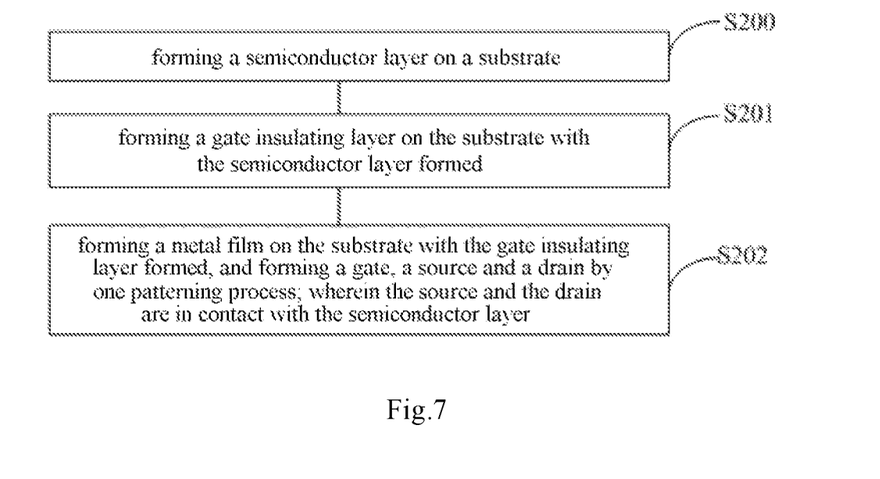
FIG. 7 is a schematic flow chart showing a preparation method for a TFT provided by embodiments of the present disclosure.

Alternatively, as shown in FIG. 7, the above preparation method for a TFT specifically comprises, at step S200, forming a semiconductor layer 30 on the substrate 10, as shown in FIGS. 5 and 6.

The semiconductor layer 30 formed on the substrate 10 can be obtained by the method for preparing the semiconductor layer 30 as described in the above steps S100 to S103 as shown in FIG. 1.

At step S201, as shown in FIGS. 5 and 6, a gate insulating layer 40 is formed on the substrate 10 with the semiconductor layer 30 formed.

The gate insulating layer 40 may be formed on the substrate 10 with the semiconductor layer 30 may be formed by a method such as atomic layer deposition (ALD) method or plasma enhanced chemical vapor deposition (PECVD) method.

At step S202, as shown in FIGS. 5 and 6, a metal film is formed on the substrate 10 with the gate insulating layer 40 formed, and the gate 70, the source 50 and the drain 60 are formed by one patterning process, wherein the source 50 and the drain 60 are in contact with the semiconductor layer 30.

The materials of the gate 70, the source 50 and the drain 60 may be one of palladium (Pd), titanium (Ti), aluminum (Al), chromium (Cr), gold (Au), platinum (Pt), titanium oxide (TiN) and tantalum nitride (TaN), or a combination thereof.

The contact of the source 50 and the drain 60 with the semiconductor layer 30 can be achieved by, as shown in FIG. 5, first forming via holes in the gate insulating layer 40, then forming a metal film by vapor deposition or sputtering process, and forming the source 50 and the drain 60 at the via holes by patterning process such that the source 50 and the drain 60 are in contact with the semiconductor layer 30. Alternatively, the contact of the source 50 and the drain 60 with the semiconductor layer 30 can be achieved by, as shown in FIG. 6, first forming via holes that penetrate the gate insulating layer 40 and the semiconductor layer 30, then forming a metal film by vapor deposition or sputtering process, and forming the source 50 and the drain 60 at the via holes by patterning process such that the source 50 and the drain 60 are in contact with the semiconductor layer 30.

In embodiments of the present disclosure, since the gate 70, the source 50 and the drain 60 are formed by one patterning process, the number of patterning processes is reduced and the production efficiency is improved. Further, optionally, forming the gate insulating layer 40 specifically comprises, as shown in FIG. 6, forming a gate insulating film on the substrate 10 with the semiconductor layer 30 formed, forming a via hole that penetrates the gate insulating film and the semiconductor layer 30 by patterning process, and forming the gate insulating layer 40, wherein the via hole is immediately close to the sidewalls 20.

Specifically, forming the above via hole may include, for example, forming a photoresist on the substrate 10 with the gate insulating film formed so that a light-transmitting portion of a mask corresponds to the region where the via hole is to be formed and a light-tight portion of the mask corresponds to the other region, performing exposure and development, removing the gate insulating film exposed after development and the semiconductor layer film under the gate insulating film by etching process, thereby forming the via hole that penetrates the gate insulating film and the semiconductor layer 30, forming the gate insulating layer 40, and then removing the photoresist on the gate insulating layer 40. Here, a positive photoresist is described as an example. However, it will be appreciated by those skilled in the art that the via hole may be fabricated using a negative photoresist. In this case, the light-tight portion of the mask corresponds to the region where the via hole is to be formed. The above etching process may employ RIE or ICP, or the like.

Embodiments of the present disclosure provide a TFT comprising, as shown in FIGS. 5 and 6, a gate 70, a gate insulating layer 40, a semiconductor layer 30, a source 50, a drain 60, and sidewalls 20 disposed on two sides of the semiconductor layer 30. The sidewalls 20 comprise a body made of $SiO_2$ material and an aminosiloxane monolayer self-assembly covering the surface of the body.

It is to be noted that the body of the sidewalls 20 which is made of $SiO_2$ material may be formed by first forming a $SiO_2$ film on the substrate 10 and patterning to form the body of the sidewalls 20 at two ends of the semiconductor layer to be formed.

It is further to be noted that the aminopropylsilane solution may be dip coated or sprayed on the substrate 10 with the body made of $SiO_2$ material formed, so that the aminopropylsilane would react with $SiO_2$, thereby forming, on the surface of the body of the sidewalls 20 which is made of $SiO_2$ material, an aminosiloxane monolayer self-assembly covering the surface of the body.

In the TFT provided by embodiments of the present disclosure, since the number of CNT tube-tube junction contact nodes in the semiconductor layer 30 is reduced, the mobility of the prepared semiconductor layer 30 is increased. Moreover, since the CNTs in the prepared semiconductor layer 30 form parallel arrays, both the uniformity and the channel positioning of the CNTs are better. In addition, the substrate 10 is not restricted by high temperature-resistant material, and the purity of the semiconductor layer 30 is higher, the proportion of metallic CNTs is lower, and the switching performance of the TFT is better. Further, since the semiconductor layer 30 is formed between two sidewalls 20 and the two sidewalls 20 can be precisely positioned on the substrate 10 during the fabricating process, the semiconductor layer 30 formed between the two sidewalls 20 can be positioned so that the formed TFT can be positioned and integrated on the substrate 10 on a large scale.

Optionally, as shown in FIGS. 5 and 6, the semiconductor layer 30 is disposed close to the substrate 10, the gate 70, the source 50 and the drain 60 are disposed in the same layer, and the gate insulating layer 40 is disposed between the semiconductor layer 30, and the gate 70, the source 50 and the drain 60. The source 50 and the drain 60 are in contact with the semiconductor layer 30.

In embodiments of the present disclosure, since the gate 70, the source 50 and the drain 60 are arranged in the same layer, they can be formed by one patterning process, thereby reducing the number of patterning processes and improving the production efficiency.

Further, optionally, as shown in FIG. 6, the source 50 and the drain 60 are in contact with both the sidewalls 20 and the semiconductor layer 30 through via holes in the gate insulating layer 40.

Embodiments of the present disclosure further provide an array substrate comprising the above-described TFT.

Each sub-pixel in the array substrate comprises, in addition to the TFT described above, a first electrode electrically connected to the drain 60.

Figure 8:
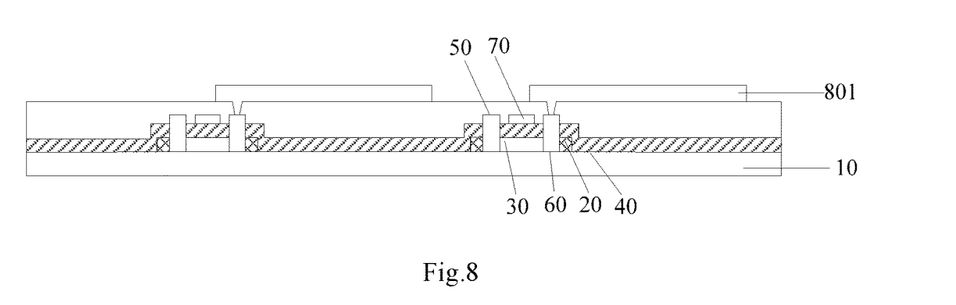
FIG. 8 is a schematic structural view of an array substrate of an LCD provided by embodiments of the present disclosure.
Figure 9:
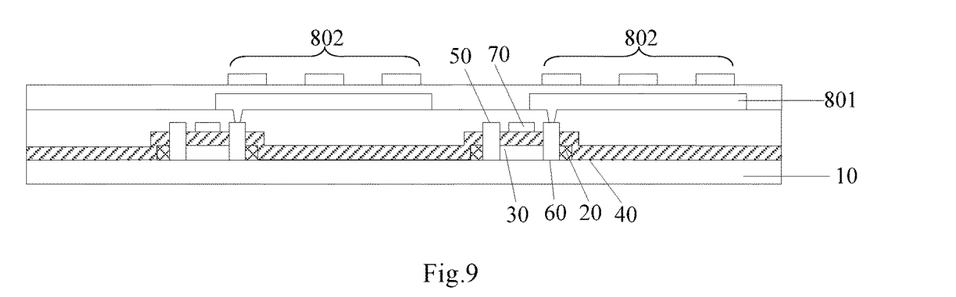
FIG. 9 is a schematic structural view of an array substrate of another LCD provided by embodiments of the present disclosure.

Specifically, when the array substrate is an array substrate of a liquid crystal display (LCD), as shown in FIG. 8, the first electrode is a pixel electrode 801. In addition, as shown in FIG. 9, the array substrate may further comprise a common electrode 802.

Figure 10:
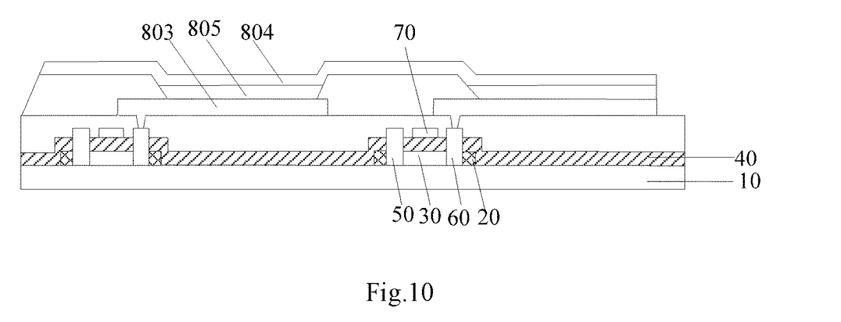
FIG. 10 is a schematic structural view of an array substrate of an OLED provided by embodiments of the present disclosure.

When the array substrate is an array substrate of an organic light-emitting diode (OLED) display, as shown in FIG. 10, the first electrode is an anode 803. On such basis, the array substrate may further comprise a cathode 804, and an organic material functional layer 805 located between the anode 803 and the cathode 804.

Figure 11:
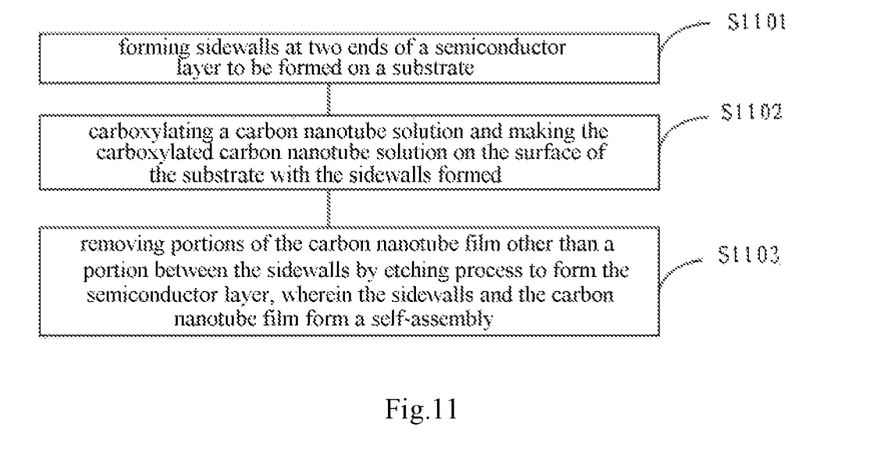
FIG. 11 is a schematic flow chart showing a preparation method for a semiconductor layer provided by embodiments of the present disclosure.

FIG. 11 is a flow chart of a method for preparing a semiconductor layer as provided by embodiments of the present disclosure. As shown in FIG. 11, in step S1101, sidewalls are formed at two ends of a semiconductor layer to be formed on a substrate. In step S1102, a carbon nanotube solution is carboxylated and the carboxylated carbon nanotube solution is made on the surface of the substrate with the sidewalls formed to form a carbon nanotube film. In step S1103, the portions of the carbon nanotube film other than the portion between the sidewalls are removed by etching process to form a semiconductor layer, wherein the sidewalls and the carbon nanotube film form a self-assembly.

Embodiments of the present disclosure provide an array substrate. Since the number of CNT tube-tube junction contact nodes in the semiconductor layer 30 is reduced, the mobility of the prepared semiconductor layer 30 is increased. Moreover, since the CNTs in the prepared semiconductor layer 30 form parallel arrays, both the uniformity and the channel positioning of the CNTs are better. In addition, the substrate 10 is not restricted by high temperature-resistant material, and the purity of the semiconductor layer 30 is higher, the proportion of metallic CNTs is lower, and the switching performance of the TFT is better. Further, since the semiconductor layer 30 is formed between two sidewalls 20 and the two sidewalls 20 can be precisely positioned on the substrate 10 during the fabricating process, the semiconductor layer 30 formed between the two sidewalls 20 can be positioned so that the formed TFT can be positioned and integrated on the substrate 10 on a large scale.

Embodiments of the present disclosure further provide a display panel comprising the above-described array substrate and an alignment substrate.

Specifically, when the array substrate is an array substrate of an LCD, the display panel may further comprise a color film substrate and a liquid crystal layer located between the array substrate and the color film substrate.

When the array substrate is an array substrate of an OLED display, the display panel may further comprise a package substrate.

It is to be noted that, although the silicon dioxide sidewalls that have been subjected to amination are described as an example in the foregoing embodiments, those skilled in the art can select based on the teachings of the present disclosure any material that can form a self-assembly with the carboxylated carbon nanotube solution to make the sidewalls, e.g. metal (Au, Ag, etc), sulfhydrylated material, etc.

The above embodiments are only specific embodiments of the present disclosure, but the protection scope of the present disclosure is not so limited. Variations or replacements that can be easily conceived by any skilled person familiar with this technical field within the technical scope revealed by the present disclosure shall be encompassed within the protection scope of the present disclosure. Thus, the protection scope of the present disclosure shall be based on the protection scope of the claims.

The invention claimed is:

1. A preparation method for a transistor, comprising:
   forming a silicon dioxide insulating layer as sidewalls at two opposing ends of a semiconductor layer to be formed on a flexible substrate;
   subjecting two opposing surfaces of the sidewalls to amination treatment using aminopropyltriethoxy silane (APTES) solution so that an aminosiloxane monolayer self-assembly is formed on the two opposing surfaces of the sidewalls;
   carboxylating a carbon nanotube solution and making the carboxylated carbon nanotube solution on a surface of the flexible substrate and between the two opposing surfaces formed with the aminosiloxane monolayer self-assembly to form a carbon nanotube film between the two opposing surfaces;
   removing portions of the carbon nanotube film above a top surface of the sidewalls to form the semiconductor layer no higher than the top of the sidewalls;
   forming a gate insulating film on the semiconductor layer;
   forming via holes in the gate insulating layer;
   forming a metal film by vapor deposition or sputtering process; and
   forming a source and a drain at the via holes by patterning process such that the source and the drain are in contact with the semiconductor layer.

2. The preparation method according to claim 1, wherein subjecting the sidewalls to amination treatment comprises:
   dip coating or spraying an aminopropylsilane solution on the substrate with the sidewalls formed.

3. The preparation method according to claim 1, wherein carboxylating a carbon nanotube solution comprises:
   mixing an oxidizing agent with the carbon nanotube solution to carboxylate the carbon nanotube solution.

4. The preparation method according to claim 1, wherein a gate, the source and the drain are formed by one patterning process.

5. The preparation method according to claim 1, wherein forming the gate insulating layer comprises:
   forming a gate insulating film on the substrate with the semiconductor layer formed, forming a via hole penetrating the gate insulating film and the semiconductor layer by patterning process to form the gate insulating layer,
   wherein the via hole is immediately close to the sidewalls.

* * * * *